(12) United States Patent
Lange

(10) Patent No.: US 7,268,551 B2
(45) Date of Patent: Sep. 11, 2007

(54) INTER-SUBJECT COHERENCE IN DT-MRI

(75) Inventor: Nicholas T. Lange, Cambridge, MA (US)

(73) Assignee: McLean Hospital Corporation, Belmont, MA (US)

( * ) Notice: Subject to any disclaimer, the term of this patent is extended or adjusted under 35 U.S.C. 154(b) by 646 days.

(21) Appl. No.: 10/823,816

(22) Filed: Apr. 14, 2004

(65) Prior Publication Data

US 2005/0240097 A1    Oct. 27, 2005

(51) Int. Cl.
*G01V 3/00* (2006.01)
(52) U.S. Cl. ...................... 324/318; 324/309
(58) Field of Classification Search ........ 324/300–322; 600/410–445; 423/300–322
See application file for complete search history.

(56) References Cited

U.S. PATENT DOCUMENTS

| | | | |
|---|---|---|---|
| 5,539,310 A | 7/1996 | Basser et al. | |
| 5,969,524 A * | 10/1999 | Pierpaoli et al. | 324/307 |
| 6,614,226 B2 * | 9/2003 | Wedeen | 324/309 |
| 6,751,495 B2 * | 6/2004 | Maier et al. | 600/410 |
| 6,804,384 B2 * | 10/2004 | Lowen | 382/128 |
| 6,996,261 B2 * | 2/2006 | deCharms | 382/131 |
| 2002/0103428 A1 | 8/2002 | DeCharms | |
| 2003/0139659 A1 | 7/2003 | Dale et al. | |
| 2005/0033154 A1 * | 2/2005 | deCharms | 600/410 |
| 2007/0127794 A1 * | 6/2007 | Niogi et al. | 382/128 |

* cited by examiner

*Primary Examiner*—Brij Shrivastav
(74) *Attorney, Agent, or Firm*—Fish & Richardson P.C.

(57) ABSTRACT

A method for estimating a value of a diffusion tensor includes obtaining, from a plurality of test subjects, DT-MRI data from which an initial estimate of the tensor can be derived. Values indicative of int-subject variation and inter-subject variation in the data are then determined. These values are used to determine a subject-specific additive offset for adjusting the DT-MRI data.

15 Claims, 7 Drawing Sheets

$$e = 0$$
$$\text{while } e \leq 6$$
$$\{ e = e + 1$$

$$\vec{a}_e = \bar{\bar{u}}_e \cdot \vec{1}_{nvox} \quad \Big\}\text{26}$$
$$\vec{r}_e = \vec{v}_e \cdot \vec{1}_{nvox} \otimes \vec{a}_e \quad \Big\} 28$$

$$b_e = \left( \frac{\vec{r}_e^T \vec{r}_e}{N(v^2-1)} \right)$$

$$c_e = \left( \frac{\text{trace }(\vec{a}_e \vec{a}_e^T)}{N-1} \right) - b_e \quad \Big\}\text{30}$$

$$\vec{\delta}_e = \frac{c_e \left( \vec{1}_{nvox} \otimes \bar{\bar{I}}_N \right)^T \vec{r}_e}{N(v-1)} \quad \Big\}\text{32}$$

$$\bar{\bar{\Delta}}_e = \vec{\delta}_e \otimes \bar{\bar{J}}_v$$
$$\bar{\bar{D}}_e^* = \bar{\bar{D}}_e + \bar{\bar{\Delta}}_e \ \} \quad \Big\} 34$$

INTER-SUBJECT COHERENCE IN DT-MRI

FIELD OF INVENTION

The invention relates to brain tractography, and in particular, to estimating a diffusion tensor field in brain tissue using data from multiple subjects.

BACKGROUND

The brain includes gray matter connected by channels of white matter, sometimes referred to as fiber bundles, or fasciculi. A purpose of tractography is to identify the paths followed by the white matter, to use those paths to form a normative map of a fully functional brain and to detect differences between functional and dysfunctional brains.

A physiological characteristic of the white matter tracks is that hydrogen protons attached to water molecules in the cerebrospinal fluid will tend to diffuse along the direction of those tracks. Thus, by observing the directions in which water diffuses at different locations in the brain, one can identify the directions of major fiber bundles within the brain tissue. The preferred direction of diffusion, and the extent of that preference, can be described by a tensor field. Thus, if one could evaluate the diffusion tensor at each point in the brain tissue, one would be able to determine the directions of the fiber bundles in that tissue.

One technique of tractography is to use diffusion tensor magnetic resonance imaging ("DT-MRI") to observe the diffusion of water in brain tissue. Using those observations, one can infer the value of the diffusion tensor at different locations in that tissue.

To reduce the likelihood that anomalies in a single subject will skew the resulting measurements, imaging is carried out on a large number of subjects. Data obtained from the subjects is then averaged across all subjects. In principle, this technique will average out differences between subjects.

One difficulty with this approach is that it is almost impossible to ensure that the brains of two different subjects are perfectly aligned during the MRI data collection period. In fact, even if one were to take two measurements of the same subject, one might obtain two different results, simply because the location of the subject's head in the MRI machine may not be identical for both measurements.

Thus, variation between measurements can arise from several causes. First, variations may arise from the anatomical differences between patients. These are among the variations that are to be averaged out. However, variations may also arise from poor "registration" (i.e. alignment of images) between subjects. These variations have no anatomical significance and will therefore tend to corrupt any estimate of the diffusion tensor. Additional sources of variation having no anatomical significance include machine noise (for example, eddy currents, RF noise, or noise in the hardware) and physiological noise (for example, artifacts, cardiac pulsation, and magnetic susceptibility). These noise sources add to variation across subjects.

SUMMARY

The invention provides a system and method for processing DT-MRI data to substantially remove the effect of unmeasured and unspecified variations when estimating values of an aggregate diffusion tensor over multiple subjects.

In one aspect, the invention includes a method for estimating a value of a diffusion tensor by obtaining, from a plurality of test subjects, DT-MRI data from which an initial estimate of the tensor can be derived. First and second values, indicative of intra-subject and inter-subject variation in the data respectively, are then determined. At least in part on the basis of the first and second values, a subject-specific additive offset is then determined for adjusting the DT-MRI data.

One practice of the invention further includes generating adjusted data by adjusting the DT-MRI data by the offset.

Another practice of the invention includes generating a bowtie plot from the adjusted data.

The DT-MRI data can represent an initial estimate of the diffusion tensor value. Alternatively, the DT-MRI data can represent echo data from which an initial estimate of the diffusion tensor can be derived.

Additional practices of the invention include those in which determining a first value includes determining an average intra-subject variance and those in which determining a second value includes determining an inter-subject variance.

In another aspect, the invention includes a computer-readable medium having encoded thereon software for estimating a value of a diffusion tensor. The software includes instructions for obtaining, from a plurality of test subjects, DT-MRI data from which an initial estimate of the tensor can be derived; determining first and second values indicative of intra-subject variation and inter-subject variation in the data respectively; and, at least in part on the basis of the first and second values, determining a subject-specific additive offset for adjusting the DT-MRI data.

Another aspect of the invention includes a system for estimating a value of a diffusion tensor. The system includes an MRI machine; a processor in data communication with the MRI machine; and a computer-readable medium in data communication with the processor. The computer-readable medium has encoded thereon software having instructions for obtaining, from a plurality of test subjects, DT-MRI data from which an initial estimate of the tensor can be derived; determining first and second values indicative of intra-subject variation and inter-subject variation in the data respectively; and, at least in part on the basis of the first and second values, determining a subject-specific additive offset for adjusting the DT-MRI data.

Unless otherwise defined, all technical and scientific terms used herein have the same meaning as commonly understood by one of ordinary skill in the art to which this invention belongs. Although methods similar or equivalent to those described herein can be used in the practice or testing of the present invention, suitable methods are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following claims, the detailed description, and the accompanying figures.

DETAILED DESCRIPTION

The tensor field within a volume of brain tissue is characterized by a 3×3 diffusion tensor associated with each voxel within the tissue:

$$D_s = \begin{bmatrix} D_{xx} & D_{xy} & D_{xz} \\ D_{xy} & D_{yy} & D_{yz} \\ D_{xz} & D_{yz} & D_{zz} \end{bmatrix}$$

Because of symmetry, the elements above and below the tensor diagonal are the same. As a result, there are six non-redundant elements in the tensor: three on the diagonal and three from either above or below the diagonal.

Tractography typically includes estimating the values of the diffusion tensor. The resulting estimate can be used to determine the orientation of white matter tracks in the brain.

One way to estimate the values of the diffusion tensor is to obtain magnetic resonance images of several subjects and to combine data from those images to obtain a canonical diffusion tensor. Because of variations associated with experimental measurements, both within a particular subject and between subjects, it is often necessary to perform certain statistical processing steps to obtain a meaningful estimate of a canonical diffusion tensor descriptive of a "standard" brain.

Figure 1:
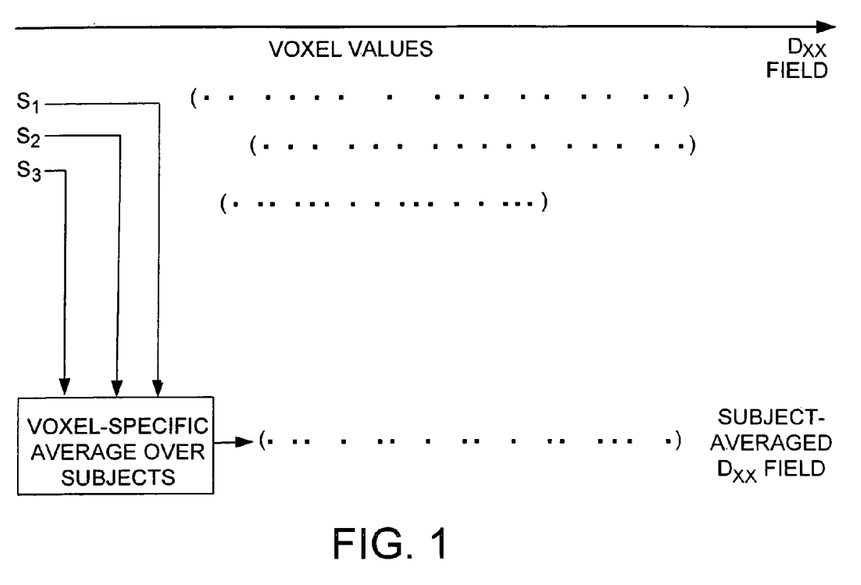
FIG. 1 depicts a procedure for estimating the value of an element of the diffusion tensor.
Figure 2:
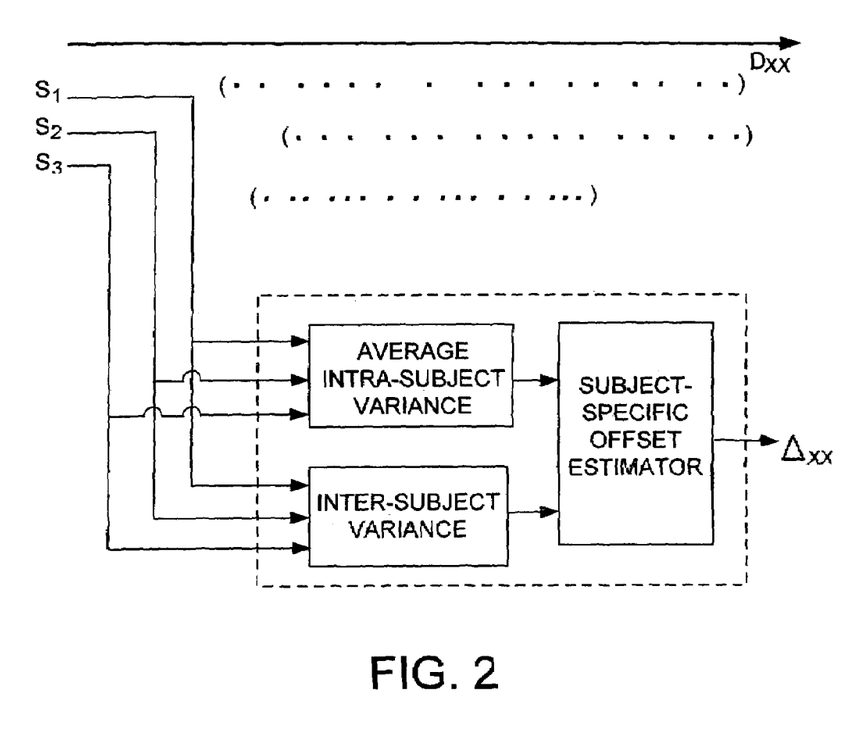
FIG. 2 depicts an alternative procedure for estimating the value of an element of the diffusion tensor.

One way to perform the statistical processing is to aggregate all the measurements from all the subjects at each voxel and to obtain an average of those measurements, at each voxel. As an example, FIG. 1 shows three sets of measurements from three different subjects, which in this case is of a value of a particular element of the diffusion tensor $D_{xx}$ over a sixteen voxel field (which in this case is a 4×4 voxel patch at a particular location within the brain. Because of expected variations over the field, these estimates are spread out as shown in FIGS. 1 and 2. In FIG. 1, an estimate for the value of the diffusion tensor element over the field is obtained by simply averaging the three measurements, one for each subject, at each voxel in the field. This statistical processing method works best when the subjects being measured are identical and all measurements are being obtained under the same circumstances.

In fact, this is clearly not the case. The subjects are not clones of each other. They are separate individuals that are anatomically and physiologically different from each other. In addition, it is virtually impossible to place the subjects into an MRI machine in such a way that the brains of each subject are at the same location relative to the MRI machine. To make matters worse, the physiological "noise" associated with each subject will differ from that associated with other subjects. For example, one subject may be apprehensive about being confined in an MRI machine and may therefore have a higher heart rate than the other subjects. Or, a particular subject may become apprehensive over time, thereby causing the physiological noise to be non-stationary during the course of a measurement. These and other data-corrupting influences remain unaccounted for in the method shown in FIG. 1.

FIG. 2 shows an alternative statistical processing method in which inter-subject statistics, i.e. variations between subjects, are taken into account to obtain an improved estimate of a particular diffusion tensor element at a specified region within the brain over the voxel field. In this case, the average of the means and the average of the variances within a particular subject (referred to herein as the average of the "intra-subject" variances) are computed over the field. The average intra-subject variance is then used to evaluate the variance between the means of each subject, a quantity referred to herein as the "inter-subject variance" to distinguish it from the "intra-subject" variance described above. An initial estimate of the value of the diffusion tensor is then corrected by an offset associated with each subject. This residual is computed on the basis of the means of both the inter-subject variance and the mean intra-subject variance.

Figure 3:
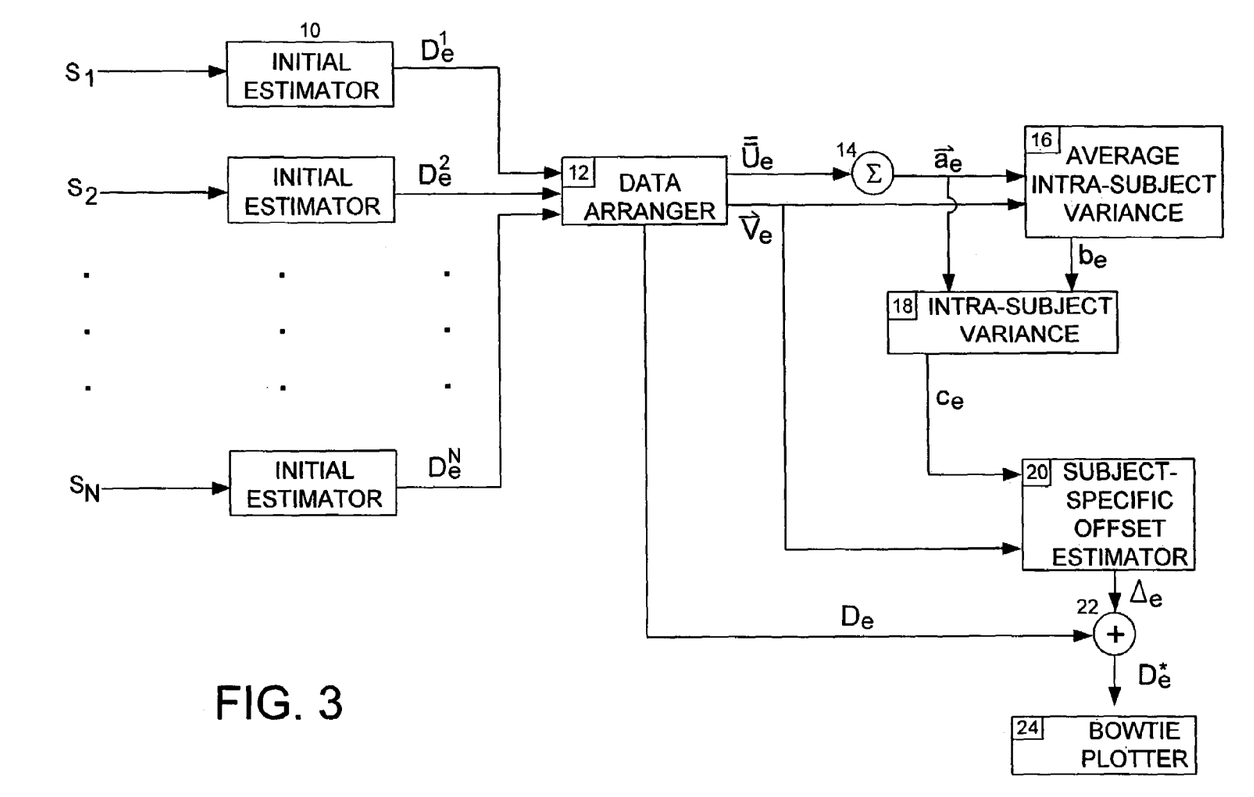
FIG. 3 schematically shows the initial diffusion tensor estimates provided to the data processing steps carried out by the invention.

Referring to FIG. 3, echo data $S_1$ is obtained from a first subject. From this echo data, an initial estimation process 10 provides a weighted least squares initial estimate of one element of the diffusion tensor for that subject by conventional methods. Assuming that the region of interest within the brain tissue is a square cross-section having v voxels on each side, this initial estimate is a v×v matrix, each element of which is an initial estimate of one of the six non-redundant elements of the diffusion tensor evaluated at one of the $v^2$ (hereafter "nvox") voxels within the volume of interest.

Since there are six non-redundant elements, there will ultimately be six such matrices associated with the first subject. However, the method of the invention is carried out separately for each of the six non-redundant tensor elements. Hence, it is useful to consider only one v×v matrix, shown as $D_e^1$ in FIG. 2, with the understanding that the remaining five matrices are processed in the same way.

As indicated in FIG. 3, echo data $S_2 \ldots S_n$ is also obtained from the remaining subjects. This echo data is likewise provided to the initial estimation process 10 to provide corresponding initial estimates of the diffusion tensor field as described above in connection with the first subject. For each subject, this results in N−1 additional v×v matrices, shown in FIG. 2 as $D_e^2 \ldots D_e^N$.

Figure 4:
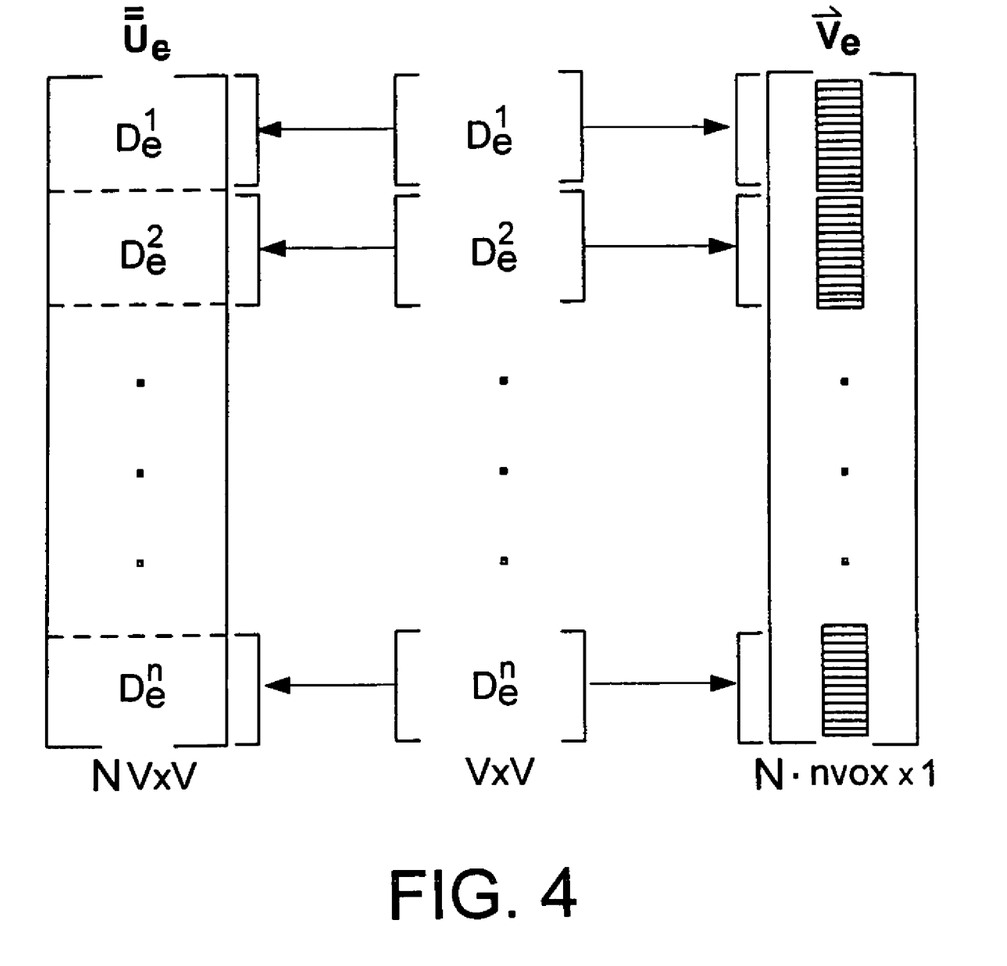
FIG. 4 shows the rearrangement of the diffusion tensor estimates in FIG. 3.

The initial diffusion tensor estimates $D_e^1 \ldots D_e^N$ are provided to a data-arranging process 12 that rearranges data representing the initial estimates into a form amenable for further processing by conventional linear algebra operators. FIG. 4 shows graphically the initial data processing steps carried out by the data-arranging process 12. The steps shown in FIG. 4 are carried out as a matter of convenience in order to integrate the statistical processing method seamlessly with conventional methods of DT-MRI.

Referring to FIG. 4, the N v×v matrices (one corresponding to each of N subjects), each containing estimates of a particular diffusion tensor element at each of nvox locations, are rearranged into N column vectors, each of which is formed by stacking the columns of its corresponding matrix. The result is that the estimate of the diffusion tensor element at a particular location always occupies the same location in a column vector. These column vectors are then stacked to create an N·nvox×1 column data vector, referred to herein as the "$V_e$" vector. The column vectors are also arranged to form a N×nvox matrix, referred to herein as the data matrix, or the "$U_e$" matrix. The data matrix and the data vector thus contain the same data, but arranged differently. Despite this redundancy, the existence of both arrangements simplifies subsequent computation.

Referring back to FIG. 3, the data matrix is provided to a summation process 14, the output of which is an N×1 vector of sums, each of which corresponds to one subject. This summation vector is provided to an intra-subject variance-estimating process 16, the output of which is an average intra-subject variance. The summation vector and the average intra-subject variance are then provided to an inter-subject variance-estimating process 18. The output of the inter-subject variance-estimating process 18, namely the inter-subject variance estimate, is in turn provided to an offset-estimating process 20, which uses it, the summation vector, and the measured data, to calculate a subject-specific additive offset for each subject. An adder 22 then adjusts the measured data by this calculated offset and provides the result to a bowtie plotting process 24 for display.

The index e for indexing the data vector and data matrix is intended to index a particular one of the six non-redundant tensor elements over the voxel field. As shown by the while loop in FIG. 5, the processing steps are carried out independently for each of the six non-redundant tensor elements in the diffusion tensor.

Figure 5:
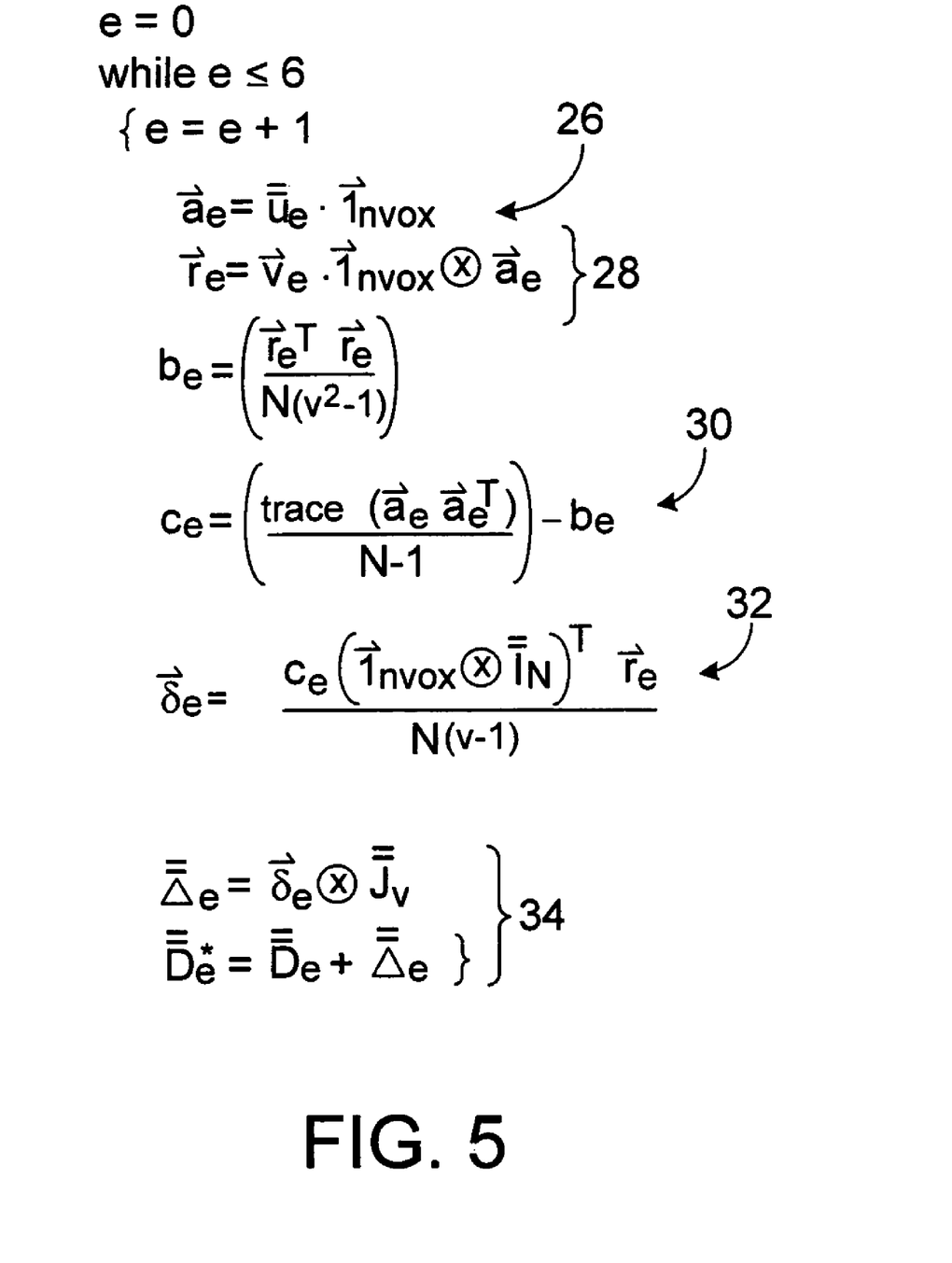
FIG. 5 is pseudo-code summarizing processing steps carried out by the invention.

Referring now to FIG. 5, an estimate of the average diffusion tensor element for each subject is evaluated (step 26). The vector $1_{nvox}$ is a column vector of nvox 1's. When multiplied by the data matrix as shown, this results in an N×1 summation vector $a_e$, each element of which is the sum of the diffusion tensor elements for each of the N subjects.

The next step is to obtain an average of the intra-subject variances corresponding to each subject (step 28). This is conveniently obtained by evaluating an intermediate N·nvox element residual vector $r_e$, which is obtained by subtracting, from the data vector $V_e$, the Kronecker product of $1_{nvox}$ and the summation vector $a_e$. The inner product of this intermediate vector with itself, when suitably normalized as shown in FIG. 5, results in a scalar $b_e$ that represents the average intra-subject variance estimate.

The next step is to obtain an estimate of the inter-subject variance (step 30). This is achieved by evaluating the outer product of the summation vector $a_e$ with itself. The result is an inter-subject variance-covariance matrix. Since the subject data is assumed to be independent across subjects, this covariance matrix is a diagonal matrix. Consequently, its trace, when suitably normalized as shown in FIG. 5, provides an unadjusted inter-subject variance estimate. The average intra-subject variance estimate, which was computed in an earlier step, is then subtracted from the unadjusted inter-variance estimate to obtain an adjusted inter-subject variance estimate, $c_e$.

The next step is to obtain a vector of subject-specific offsets. This vector is a weighted version of the residual error vector $r_e$ (step 32). First, an intermediate vector is obtained by pre-multiplying the residual error vector re with a matrix of 1's having a dimensionality selected to cause the resulting product to be an N-element column vector. The result, when weighted by the average inter-subject variance estimate, $c_e$ and then normalized, is the weighted subject-specific offset vector $\delta_e$. The elements of this vector are then replicated and rearranged into an N·v×v subject-specific offset matrix $\Delta_e$.

Next, the diffusion tensor estimate $D_e$ is adjusted, on an element-by-element basis, by the offset matrix $\Delta_e$ (step 34). The result is a corrected diffusion tensor estimate that is ultimately provided to the bowtie plot process 24.

Figure 6:
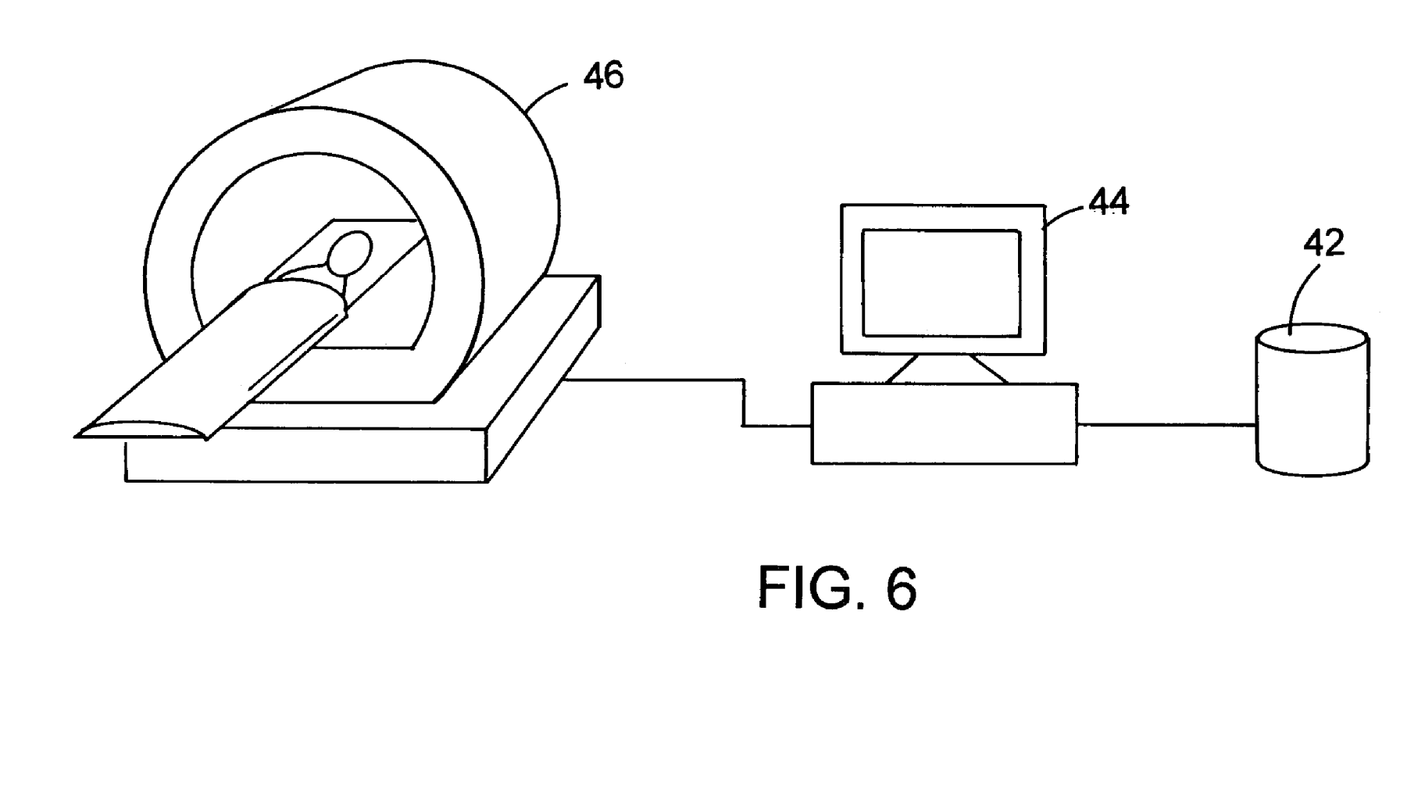
FIG. 6 illustrates an MRI machine for carrying out the data processing steps of the invention.

Referring to FIG. 6, software for carrying out the invention is generally embodied as instructions stored on a computer-readable medium 42 that is associated with a processor 44 configured to receive data from a magnetic resonance imaging machine 46. The data is typically stored on a computer-readable medium 42, from which it can be accessed by the software. The computer readable medium 42 includes instructions that, when executed by a processor 44, cause the processor 44 to carry out the steps described herein on the data provided by the MRI machine 46.

As described herein, the method is carried out on the initial estimates of the diffusion tensor elements. However, the same method can be applied to the MRI echo data used to generate the estimates of the diffusion tensor elements themselves. The main differences in this case would be that the matrix dimension nvox becomes an integer consistent with the sizes of the matrices representing the MRI data. The separation of the variance into an intra-subject and an inter-subject component, and the use of the inter-subject component to generate an additive offset remains the same in both cases.

The particular steps described herein provide a convenient method, using linear-algebraic operators, for manipulating data arranged as described in connection with FIG. 4. However, there may be alternative ways to manipulate data as arranged in FIG. 4 to achieve the same effects. Moreover, data may be arranged in a manner different from that shown in FIG. 4, in which case the details of the data processing steps described may change.

EXAMPLE

DT-MRI data was obtained from twelve healthy male volunteers as described in Jones, et al., "Spatial normalization and averaging of diffusion tensor MRI sets," NeuroImage, vol. 17, pp/592-617, 2002. Isotropic resolution (2.5 mm) data was collected on a GE Signa 1.5 T LX system using a sequence optimized for DT-MRI of white matter, as described in Jones, Williams, et al., "Isotropic resolution diffusion tensor imaging with whole brain acquisition in a clinically acceptable time" Human Brain Mapping, vol. 15, pp 216-230, 2002.

Following correction of distortion from eddy currents, the diffusion tensor was estimated for each voxel in each subject using linear regression techniques described in Basser, et al. "Estimation of the effective self-diffusion tensor from the NMR spin echo", J. Magnetic Resonance B, vol. 103, pp. 247-254, 1994.

The DT-MRI volume from each subject was elastically normalized to a standard anatomical reference space, using the MNI EPI template supplied as part of SPM (The Wellcome Department of Cognitive Neurology, Institute of Neurology, London, UK), by employing a procedure similar to that outlined in Jones, et al., yet with elastic registration, (as described in G. K. Rohde, et al., "The adaptive bases algorithm for intensity-based nonrigid image registration," IEEE Trans. Med. Imaging, vol. 22, no. 11, pp. 1470-1479, 2003), and preservation of principal directions (as described in D. C. Alexander, et al., "Spatial transformations of diffusion tensor magnetic resonance images," IEEE Trans. Med. Imaging, vol. 20, pp. 1131-1139, 2001) without the affine transformation used previously in Jones, et al.

Once each subject's tensor volume had been estimated, the principal eigenvector, which was the eigenvector associated with the largest eigenvalue, was determined in each voxel and its 2-D projection onto the plane was represented by a small bar of unit length. The orientation plots thus obtained from each of the twelve subjects were then overlaid. This visualization method is termed a 'bow-tie plot' due to its appearance at those voxels in which the principal eigenvectors from the twelve subjects are modestly well aligned.

Figure 7:
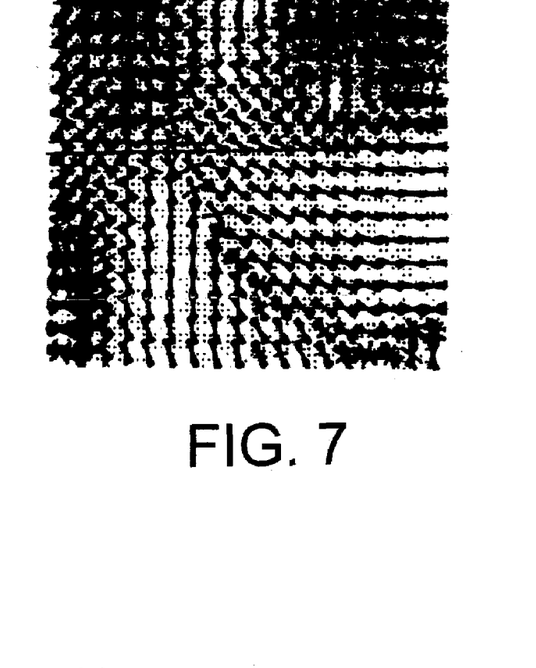
FIG. 7 is a bowtie plot obtained by using data processing steps consistent with FIG. 1.
Figure 8:
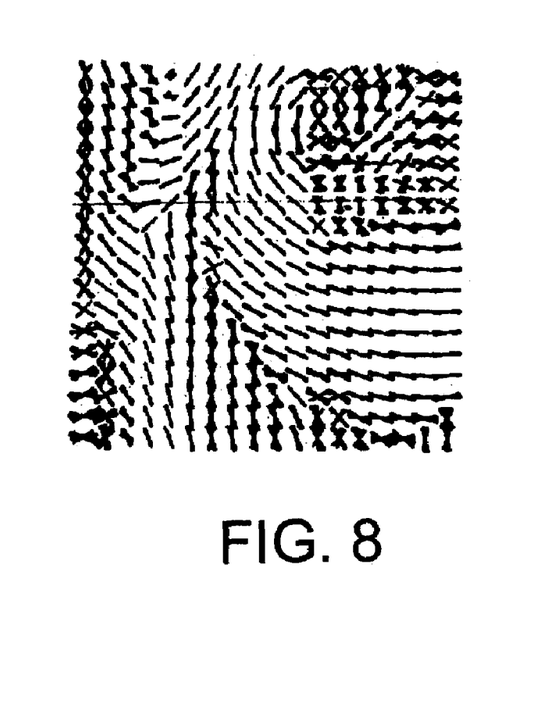
FIG. 8 is a bowtie plot obtained by using data processing steps consistent with FIG. 2.

FIGS. 8 and 9 provide a bow-tie plot comparison of results obtained by the method described herein and those obtained using the method described by Jones, et al. within the splenium of the corpus callosum. In FIG. 7, the principal eigenvectors (tight bow-ties) are relatively coherent within the white matter tracks but less coherent in regions of gray matter and CSF.

In FIG. 8, in which the same data is subjected to the method disclosed herein, inter-subject orientation coherence is improved in virtually all voxels.

IMPLEMENTATIONS

The invention can be implemented in hardware or software, or a combination of both. The invention can be implemented in computer programs using standard programming techniques following the method steps and figures described herein. The programs should be designed to execute on programmable computers each comprising a processor, a data storage system (including memory and/or storage elements), at least one input device, and at least one output device, such as a CRT or printer. Program code is applied to input data to perform the functions described herein and generate output information. The output information is applied to one or more output devices such as a CRT, as described herein.

Each program is preferably implemented in a high level procedural or object oriented programming language to communicate with a computer system. However, the programs can be implemented in assembly or machine language, if desired. In any case, the language can be a compiled or interpreted language.

Each such computer program is preferably stored on a storage medium or device (e.g., ROM or magnetic diskette) readable by a general or special purpose programmable computer, for configuring and operating the computer when the storage media or device is read by the computer to perform the procedures described herein. The system can also be considered to be implemented as a computer-readable storage medium, configured with a computer program, where the storage medium so configured causes a computer to operate in a specific and predefined manner to perform the functions described herein.

OTHER EMBODIMENTS

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A system for estimating a value of a diffusion tensor, said system comprising:
    an MRI machine;
    a processor in data communication with the MRI machine;
    a computer-readable medium in data communication with the processor, the computer-readable medium having encoded thereon software for estimating a value of a diffusion tensor, said software comprising instructions for;
    obtaining, from a plurality of test subjects, DT-MRI data from which an initial estimate of the tensor can be derived;
    determining a first value indicative of intra-subject variation in said data;
    determining a second value indicative of inter-subject variation in said data; and
    at least in part on the basis of said first and second values, determining a subject-specific additive offset for adjusting said DT-MRI data.

2. A method for estimating a value of a diffusion tensor, said method comprising:
    obtaining, from a plurality of test subjects, DT-MRI data from which an initial estimate of the tensor can be derived;
    determining a first value indicative of intra-subject variation in said data;
    determining a second value indicative of inter-subject variation in said data; and
    at least in part on the basis of said first and second values, determining a subject-specific additive offset for adjusting said DT-MRI data.

3. The method of claim 2, further comprising generating adjusted data by adjusting said DT-MRI data by said offset.

4. The method of claim 3, further comprising generating a bowtie plot from said adjusted data.

5. The method of claim 2, further comprising selecting said DT-MRI data to represent an initial estimate of said diffusion tensor value.

6. The method of claim 2, further comprising selecting said DT-MRI data to represent echo data from which an initial estimate of the diffusion tensor can be derived.

7. The method of claim 2, wherein determining a first value comprises determining an average intra-subject variance.

8. The method of claim 2, wherein determining a second value comprises determining an inter-subject variance.

9. A computer-readable medium having encoded thereon software for estimating a value of a diffusion tensor, said software comprising instructions for:
    obtaining, from a plurality of test subjects, DT-MRI data from which an initial estimate of the tensor can be derived;
    determining a first value indicative of intra-subject variation in said data;
    determining a second value indicative of inter-subject variation in said data; and
    at least in part on the basis of said first and second values, determining a subject-specific additive offset for adjusting said DT-MRI data.

10. The computer-readable medium of claim 9, wherein the software further comprises instructions for generating adjusted data by adjusting said DT-MRI data by said offset.

11. The computer-readable medium of claim 10, wherein the software further comprises instructions for generating a bowtie plot from said adjusted data.

12. The computer-readable medium of claim 9, wherein the software further comprises instructions for selecting said DT-MRI data to represent an initial estimate of said diffusion tensor value.

13. The computer-readable medium of claim 9, wherein the software further comprises instructions for selecting said DT-MRI data to represent echo data from which an initial estimate of the diffusion tensor can be derived.

14. The computer-readable medium of claim 9, wherein the instructions for determining a first value comprise instructions for determining an average intra-subject variance.

15. The computer-readable medium of claim 9, wherein the instructions for determining a second value comprise instructions for determining an inter-subject variance.

* * * * *